US 11,239,921 B2

(12) United States Patent
Nakada

(10) Patent No.: US 11,239,921 B2
(45) Date of Patent: Feb. 1, 2022

(54) BLADE DEVICE

(71) Applicant: NEC CORPORATION, Tokyo (JP)

(72) Inventor: Tatsuhiro Nakada, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 16/966,059

(22) PCT Filed: Feb. 18, 2019

(86) PCT No.: PCT/JP2019/005872
§ 371 (c)(1),
(2) Date: Jul. 30, 2020

(87) PCT Pub. No.: WO2019/163713
PCT Pub. Date: Aug. 29, 2019

(65) Prior Publication Data
US 2020/0403708 A1 Dec. 24, 2020

(30) Foreign Application Priority Data
Feb. 20, 2018 (JP) .............................. JP2018-027513

(51) Int. Cl.
*H04B 10/07* (2013.01)
*H04B 10/572* (2013.01)
(Continued)

(52) U.S. Cl.
CPC ........... *H04B 10/572* (2013.01); *H04B 10/07* (2013.01); *H04B 10/11* (2013.01); *H04B 10/803* (2013.01); *H05K 7/1487* (2013.01)

(58) Field of Classification Search
CPC ...... H04B 10/572; H04B 10/11; H04B 10/07; H04B 10/803; H05K 7/1487
See application file for complete search history.

(56) References Cited

U.S. PATENT DOCUMENTS

2005/0036789 A1* 2/2005 Bjorndahl ............ H04B 10/801
398/118
2009/0140755 A1* 6/2009 Byers ...................... H05K 1/14
324/763.01
(Continued)

FOREIGN PATENT DOCUMENTS

JP 2005-065221 A 3/2005
JP 2009-188579 A 8/2009
(Continued)

OTHER PUBLICATIONS

International Search Report of PCT/JP2019/005872 dated Apr. 23, 2019 [PCT/ISA/210].
(Continued)

*Primary Examiner* — Dzung D Tran
(74) *Attorney, Agent, or Firm* — Sughrue Mion, PLLC

(57) ABSTRACT

In order to reduce the number of wires between blades, this blade device is provided with: a control blade for sending first information, which is at least one of control information for controlling a blade to be controlled and monitor information for monitoring the blade to be controlled, to the blade to be controlled by wireless communication; and the blade to be controlled which performs a process in accordance with the first information that has been received.

14 Claims, 7 Drawing Sheets

(51) Int. Cl.
*H04B 10/11* (2013.01)
*H04B 10/80* (2013.01)
*H05K 7/14* (2006.01)

(56) References Cited

U.S. PATENT DOCUMENTS

2010/0211737 A1\* 8/2010 Flynn .................. G06F 12/0246
711/114
2013/0163420 A1\* 6/2013 Chi ......................... H04L 47/24
370/230
2016/0196229 A1\* 7/2016 Shichi .................. G06F 13/362
710/316

FOREIGN PATENT DOCUMENTS

JP  2013-542661 A  11/2013
WO  2004/042965 A2  5/2004
WO  2015/040690 A1  3/2015

OTHER PUBLICATIONS

Written Opinion of PCT/JP2019/005872 dated Apr. 23, 2019 [PCT/ISA/237].

\* cited by examiner

BLADE DEVICE

CROSS REFERENCE TO RELATED APPLICATIONS

This application is a National Stage of International Application No. PCT/JP2019/005872, filed Feb. 18, 2019, claiming priority to Japanese Patent Application No. 2018-027513, filed Feb. 20, 2018, the contents of all of which are incorporated herein by reference in their entirety.

TECHNICAL FIELD

The present invention relates to a blade device including a plurality of blades.

BACKGROUND ART

In some cases, a transmission device or the like has a blade structure in which each constituent function block is arranged as being divided into blades that are substrates having the same shape, and the arranged blades are mounted in a shelf or the like. The blade structure is intended for improving a mounting density and ensuring flexibility.

In a device having a blade structure (hereinafter, referred to as a blade device), it is necessary to synchronize operations of blades constituting the blade device. For this reason, control or the like for synchronization is performed on the blade device. In a general device, a control interface for performing the control is wired in a backboard.

FIG. 1 is a concept diagram illustrating a configuration of a blade device 501 as an example of a general blade device.

The blade device 501 includes a control blade 100 and controlled blades 201 to 20N that are N blades.

The control blade 100 includes a control processing unit 103 and a hub 102.

Each of the controlled blades 201 to 20N includes an associated one of controlled processing units 2511 to 251N.

The control processing unit 103 of the control blade 100 includes a CPU, a memory, a peripheral device, and the like. The CPU is an abbreviation for a central processing unit. The control processing unit 103 is connected to the hub 102 by a wiring inside the control blade 100.

The control processing unit 103 controls and monitors operation of each of the controlled blades 201 to 20N (each controlled blade). The control is setting of an operation condition in each controlled blade, for example. The monitoring is monitoring of malfunction and processing performance, for example.

The control processing unit 103 generates a signal including control information for the control and monitoring information for the monitoring, and inputs the signal into the hub 102. The signal is a 1000G BASE-T signal in Ethernet (registered trademark), for example.

The hub 102 distributes, to the controlled blades, the signal generated by the control processing unit 103. The hub 102 also inputs, into the control processing unit 103, a signal including response information and the like sent from each of the controlled blades.

The controlled processing unit of each controlled blade operates according to the signal sent from the control blade 100. The controlled processing unit of each controlled blade also sends, to the control blade 100, a signal including predetermined response information and the like to the signal sent from the control blade 100.

In each controlled blade, the controlled processing unit and the like are formed on a blade-shaped substrate having substantially the same shape. A type and the number N of the blades differ depending on a function and a scale required for the device. The controlled processing unit of each controlled blade includes a CPU, a memory, a peripheral device, and the like. The hub 102 and the controlled processing unit of each controlled blade are connected to each other via a wiring inside the controlled blade and a wiring in a backboard of a shelf.

PTL 1 discloses a method of fanning-out, by one diverging element, one optical signal among a plurality of nodes from an optical signal emitter, and broadcast-transmitting the optical signal to one receiver by a light collecting-focusing element.

PTL 2 discloses an electronic device configured in such a way that a plurality of control boards are serially installed via connectors provided in a backboard, and high-frequency digital signal transmission is performed by wiring patterns formed in the control boards and the backboard.

CITATION LIST

Patent Literature

[PTL 1] International Publication No. WO 2004/042965
[PTL 2] Japanese Unexamined Patent Application Publication No. 2009-188579

SUMMARY OF INVENTION

Technical Problem

In the blade device described in the section of the Background Art, each blade is connected via the wiring in the backboard of the shelf as described above. Improvement in a technique of mounting and designing has enabled transmission of more than a gigabyte band per wiring of the backboard.

However, widening a bandwidth of a signal accommodated in a transmission device also has been progressing. Progressing of widening a bandwidth of a signal accommodated in the transmission device indicates increasing an amount of data to be processed per unit time by the transmission device. Thus, an amount of data to be transmitted per unit time in the backboard also increases.

In order to increase an amount of data to be transmitted per unit time in the backboard, it is effective to raise a bit rate per unit wiring, and to increase the number of wirings and transfer the data in parallel in the wirings.

Raising a bit rate causes noise resistance to decline, and causes an error to easily occur by influence of waveform distortion or the like due to transmission. Although error correction can be performed on a reception side, when an error rate becomes high, a correction limit is exceeded, and correction cannot be performed. Accordingly, there is a limit in increasing, only by increasing a bit rate per unit wiring, an amount of data transmitted per unit time.

In such a case, it is effective to increase the number of wirings. In this regard, in order to increase the number of wirings, a large wiring area in the backboard needs to be secured. However, in some cases, it is difficult to secure a wiring area in the backboard.

An object of the present invention is to provide a blade device and the like that can decrease the number of wirings between blades.

Solution to Problem

A blade device according to the present invention includes: a control blade sending, by wireless communication, to a controlled blade, first information being at least one of control information for controlling the controlled blade and monitoring information for monitoring the controlled blade; and the controlled blade performing processing that follows the received first information.

Advantageous Effects of Invention

The blade device and the like according to the present invention can decrease the number of wirings between blades.

EXAMPLE EMBODIMENT

[Configuration and Operation]

Figure 1:
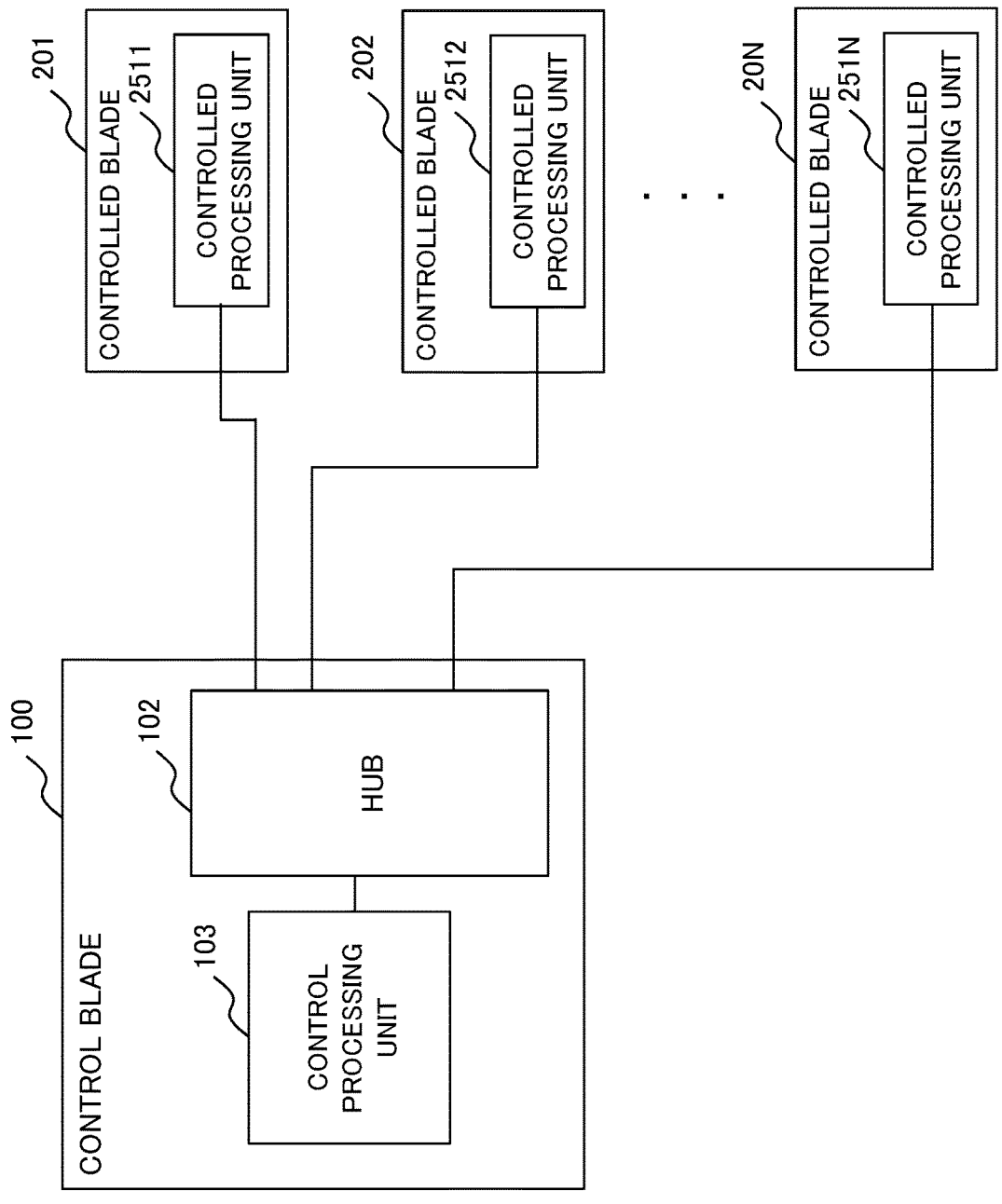
FIG. 1 is a concept diagram illustrating a configuration example of a general blade device.
Figure 2:
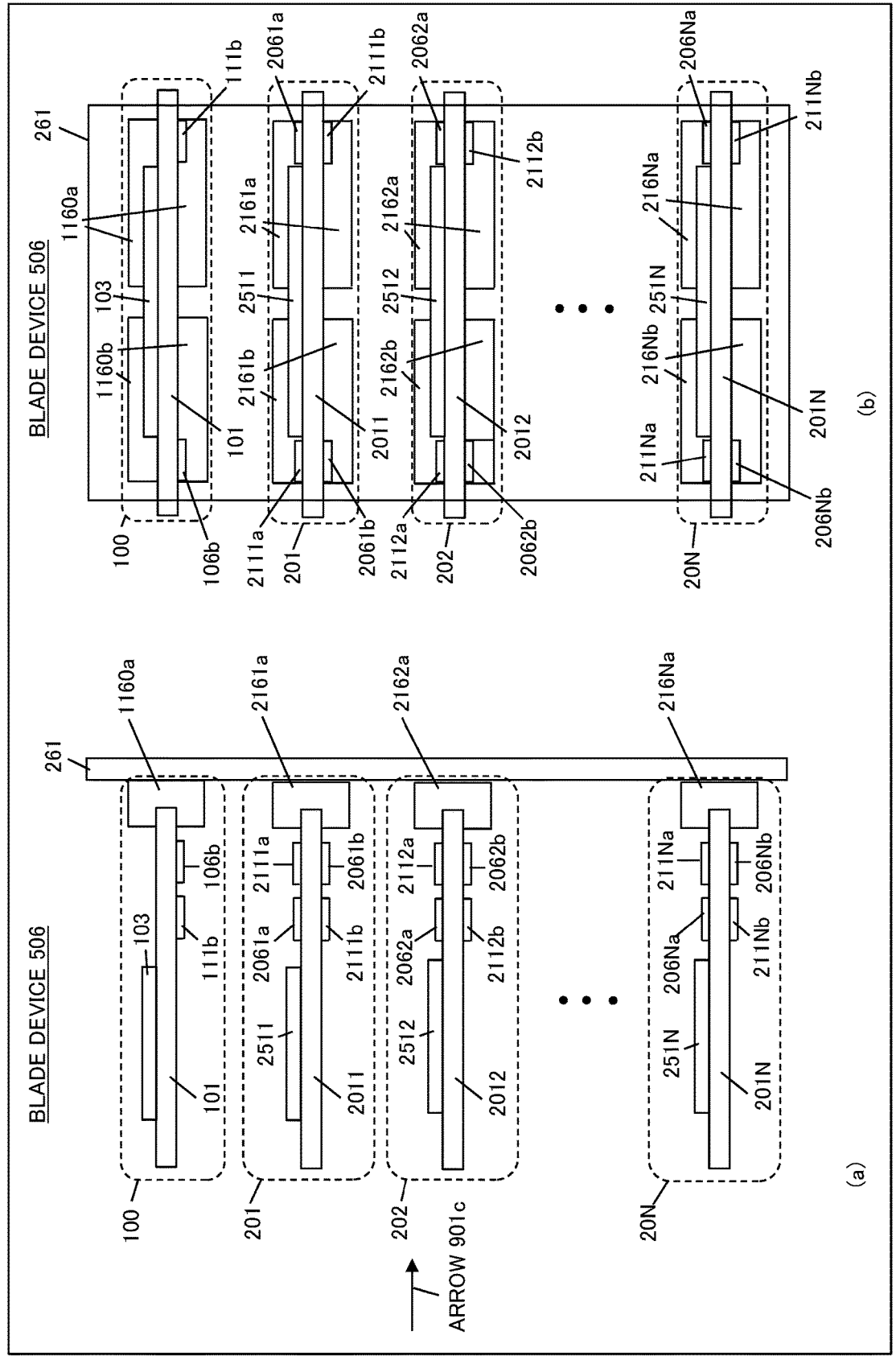
FIG. 2 is a concept diagram illustrating a configuration example of a blade device according to the present example embodiment.

FIG. 2 is a concept diagram illustrating a configuration of a blade device 506 as an example of a blade device according to the present example embodiment.

In FIG. 2, (a) is a first side view of the blade device 506. In FIG. 2, (b) is a second side view of the blade device 506a in an assumed case of viewing in a direction of the arrow 901c illustrated in (a) of FIG. 2.

The blade device 506 includes a control blade 100, controlled blades 201 to 20N as N controlled blades, and a backboard 261.

The control blade 100 and the controlled blades 201 to 20N are arranged at equal intervals in the up-down direction of FIG. 2 by an unillustrated shelf in such a way that surfaces of the blades are substantially parallel to each other.

The control blade 100 includes a substrate 101, a control processing unit 103, a transmission unit 106b, a reception unit 111b, and connectors 1160a and 1160b.

In the substrate 101, there are formed wirings between unillustrated constituent portions included in the control processing unit 103, unillustrated wirings making connections of the control processing unit 103, the transmission unit 106b, the reception unit 111b, and the connectors 1160a and 1160b, and the like.

Each of the connectors 1160a and 1160b is connected to a connector of each controlled blade by an unillustrated wiring on the backboard 261.

The control processing unit 103 includes a CPU, a memory, a peripheral device, and the like. The CPU is an abbreviation for a central processing unit. The control processing unit 103 is connected to each of the transmission unit 106b, the reception unit 111b, and the connector 1160a by a wiring formed in the substrate 101.

The control processing unit 103 controls and monitors operation of each of the controlled blades 201 to 20N (each controlled blade). The control is setting of an operation condition in each controlled blade, for example. The monitoring is monitoring of malfunction and processing performance, for example.

The control processing unit 103 generates an electric signal including control information for the control and monitoring information for the monitoring (hereinafter, referred to as "control-and-monitoring information"), and inputs the electric signal into the transmission unit 106b. The electric signal is a 1000G BASE-T signal in Ethernet (registered trademark), for example.

When receiving, from the reception unit 111b, information sent from each controlled blade, the control processing unit 103 performs processing associated with the information.

The transmission unit 106b of the control blade 100 faces a reception unit 2111a of the controlled blade 201. The transmission unit 106b converts, into an optical signal, an electric signal sent from the control processing unit 103. The transmission unit 106b sends the optical signal to the reception unit 2111a of the controlled blade 201. The optical signal includes the above-described control-and-monitoring information. The control-and-monitoring information is transmitted from the control blade 100 to the controlled blade 201 by spatial optical communication with the optical signal.

The optical signal stores sending-destination information that represents the controlled blade as a sending destination. The sending-destination information is stored at a head portion of the control-and-monitoring information, for example.

The reception unit 111b of the control blade 100 faces a transmission unit 2061a of the controlled blade 201. The reception unit 111b converts, into an electric signal, an optical signal received from the transmission unit 2061a of the controlled blade 201. The optical signal includes response information to the control-and-monitoring information.

The response information stores sending-source information representing the controlled blade that has sent a signal including the response information. The sending-source information is stored at a head portion of the response information, for example. Based on the sending-source information, the control processing unit 103 specifies the controlled blade that is the sending-source of the response information.

The controlled blade 20v (v is one or more and equal to or less than N) includes a substrate 201v, a controlled processing unit 251v, transmission units 206va and 206vb, reception units 211va and 211vb, and connectors 216va and 216vb.

In the substrate 201v, there are formed wirings between portions included in the controlled processing unit 251v, and unillustrated wirings making connections of the controlled processing unit 251v, the transmission units 206va and 206vb, the reception units 211va and 211vb, and the connectors 2161a and 2161b.

Each of the connectors 216va and 216vb is connected to the connectors of the control blade 100 and the different controlled blade by unillustrated wirings on the backboard 261.

The reception unit 211va included in the controlled blade 20v converts, into an electric signal, an optical signal sent by the transmission unit facing the reception unit 211va.

When v is 1, the transmission unit is the transmission unit 106b of the control blade 100. When v is equal to or more than 2 and equal to or less than N, the transmission unit is the transmission unit 206(v−1)b of the controlled blade 20(v−1).

The reception unit 211va inputs the electric signal into an input terminal of the controlled processing unit 251v and into the transmission unit 206vb.

When the electric signal is input from the reception unit 211va into the transmission unit 206vb, the transmission unit 206vb converts the electric signal into an optical signal. The optical signal is sent to the reception unit 211(v+1)a being included in the controlled blade 20(v+1) and facing the transmission unit 206vb. By spatial optical communication with the optical signal, the control-and-monitoring information is transmitted from the controlled blade 20v to the controlled blade 20(v+1).

However, when a value of v is N, there is not a reception unit 211(v+1)a that faces the facing transmission unit 206vb, and thus, the optical signal is sent out downward in FIG. 2 and is not input into any of the reception units illustrated in FIG. 2.

In the case of V=N, the controlled processing unit 251v may perform detection of being positioned at the bottom, and may send a control signal to the transmission unit 206Nb, thereby stopping sending-out of the optical signal downward from the transmission unit 206Nb. In this case, for example, the controlled processing unit 251v performs the detection by determining that an optical signal is not input into the reception unit 211Nb in a predetermined period of time.

Meanwhile, an optical signal sent from the transmission unit 206(v+1)a being included in the controlled blade 20(v+1) and facing the reception unit 211vb is input into the reception unit 211vb. The optical signal includes the above-described response information. However, when a value of v is N, there is not a transmission unit facing the reception unit 211vb, and thus, an optical signal is not input into the reception unit 211vb.

The reception unit 211vb converts an input optical signal into an electric signal. The electric signal is input into the transmission unit 206va.

The transmission unit 206va converts, into an optical signal, an electric signal sent from the reception unit 211vb or the controlled processing unit 251v. The optical signal is sent to the reception unit 211(v−1)b being included in the controlled blade 20(v−1) and facing the transmission unit 206va. By spatial optical communication with the optical signal, information is transmitted from the controlled blade 20v to the controlled blade 20(v−1). However, when a value of v is 1, the optical signal is sent to the reception unit 111b being included in the control blade 100 and facing the transmission unit 2061a.

When an electric signal is sent from the reception unit 211va to the controlled processing unit 251v, the controlled processing unit 251v determines whether control-and-management information included in the electric signal is addressed to the controlled blade 20v. For example, the controlled processing unit 251v performs the determination, based on the above-described sending-destination information included in the control-and-management information.

When determining that the control-and-management information is addressed to the controlled blade 20v, the controlled processing unit 251v performs processing that follows the control-and-management information. For example, the processing includes sending, to the control blade 100, response information associated with the control-and-management information.

When sending the response information to the control blade 100, the controlled processing unit 251v sends, to the transmission unit 206va, an electric signal including the response information.

Figure 3:
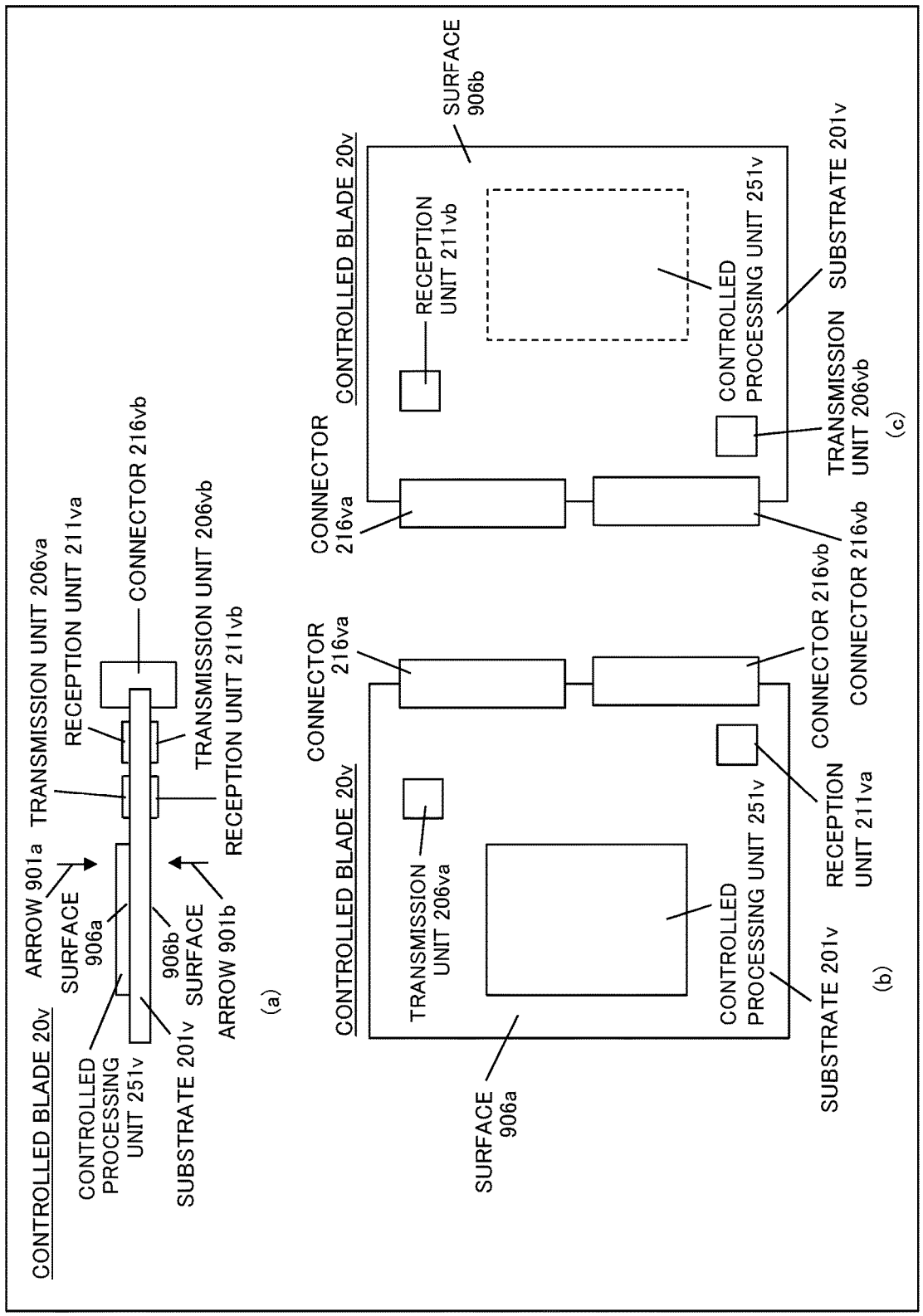
FIG. 3 is a concept diagram illustrating a first example of a controlled blade.

FIG. 3 is a concept diagram illustrating the controlled blade 20v (v is one or more and equal to or less than N) illustrated in FIG. 2.

In FIG. 3, (a) is a diagram in an assumed case of viewing the controlled blade 20v in the same manner as in (a) of FIG. 2. In FIG. 3, (b) is a diagram of the controlled blade 20v in an assumed case of viewing in a direction of the arrow 901a illustrated in (a) of FIG. 3. In FIG. 3, (c) is a diagram of the controlled blade 20v in an assumed case of viewing in a direction of the arrow 901b illustrated in (a) of FIG. 3.

The transmission unit 206va and the reception unit 211va are arranged on a surface 906a of the substrate 201v. The reception unit 211vb and the transmission unit 206vb are arranged on a surface 906b.

The transmission unit 206va and the reception unit 211vb are arranged at the same position in the viewing manner illustrated in (b) and (c) of FIG. 3. The reception unit 211va and the transmission unit 206vb are arranged at the same position in the viewing manner illustrated in (b) and (c) of FIG. 3.

The transmission unit 206va, the reception unit 211vb, and the controlled processing unit 251v are connected to each other by unillustrated wirings. The reception unit 211va, the transmission unit 206vb, and the controlled processing unit 251v are connected to each other by unillustrated wirings.

The transmission unit 206va and the reception unit 211va are installed at positions separated from each other, and the reception unit 211vb and the transmission unit 206vb are installed at positions separated from each other.

A first optical signal sent to the reception unit 211(v−1)b by the transmission unit 206va illustrated in FIG. 2 and a second optical signal sent to the reception unit 211va by the transmission unit 206(v−1)b do not overlap with each other. When two optical signals having the same wavelength overlap with each other, interference of the light occurs. In this case, there is a case where transmission and reception of optical signals is hindered. However, in the case of arrangement illustrated in FIG. 3, the first optical signal and the second optical signal do not overlap with each other, and thus, normal transmission and reception of optical signals can be performed even when the optical signals having the same wavelength are output by the transmission unit 206va and the transmission unit 206(v−1)b.

In the case of the arrangement illustrated in FIG. 3, interference of light does not occur, and thus, examples usable as a communication method for optical space communication between the transmission unit and the associated reception unit include a method that is based on the IrSimple method or the IrDA and in which a wavelength has been determined. The IrSimple is an abbreviation for Infrared Simple. The IrDA is an abbreviation for Infrared Data Association.

In the case of the arrangement illustrated in FIG. 3, the transmission unit 206va and the transmission unit 206(v−1)b may output optical signals having different wavelengths.

Figure 4:
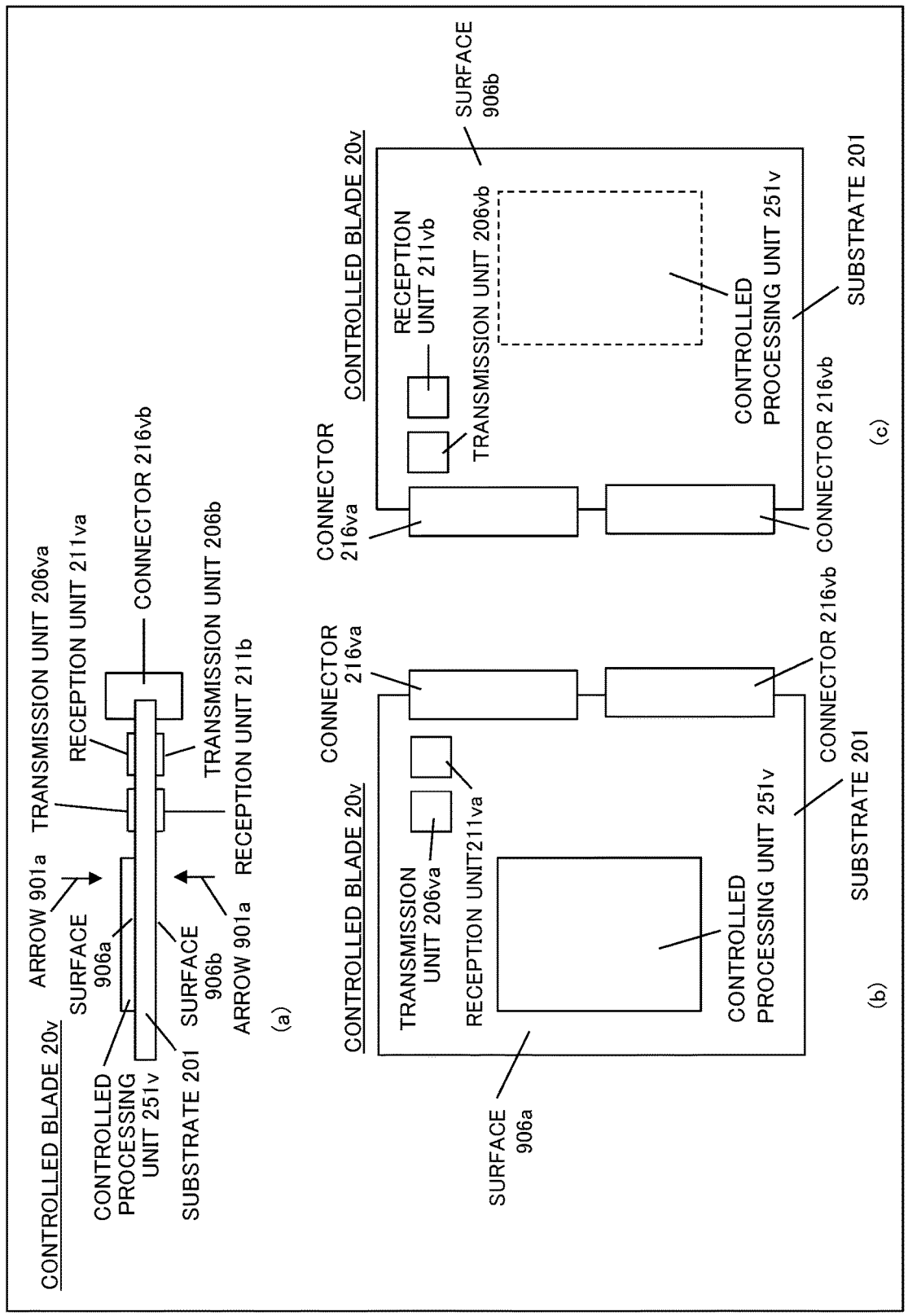
FIG. 4 is a concept diagram illustrating a second example of the controlled blade.

FIG. 4 is a concept diagram illustrating a variation of arrangement of the transmission units and the reception units in the controlled blade 20v.

In the arrangement example illustrated in FIG. 4, the transmission unit 206va and the reception unit 211va are close to each other, and the reception unit 211vb and the transmission unit 206vb are close to each other.

In the case of the arrangement illustrated in FIG. 4, a first optical signal sent to the reception unit 211(v–1)b by the transmission unit 206va illustrated in FIG. 2 and a second optical signal sent to the reception unit 211va by the transmission unit 206(v–1)b overlap with each other. When two optical signals having the same wavelength overlap with each other, interference of the light occurs. In this case, there is a case where transmission and reception of optical signals is hindered. Accordingly, in the case of the arrangement illustrated in FIG. 4, there is a possibility that outputting optical signals of the same wavelength by the transmission unit 206va and the transmission unit 206(v–1)b may cause a problem in transmission and reception of the optical signals. However, also in the case illustrated in FIG. 4, the transmission unit 206va and the transmission unit 206(v–1)b output optical signals having different wavelengths that do not cause interference, thereby enabling normal transmission and reception of the optical signals to be performed.

Figure 5:
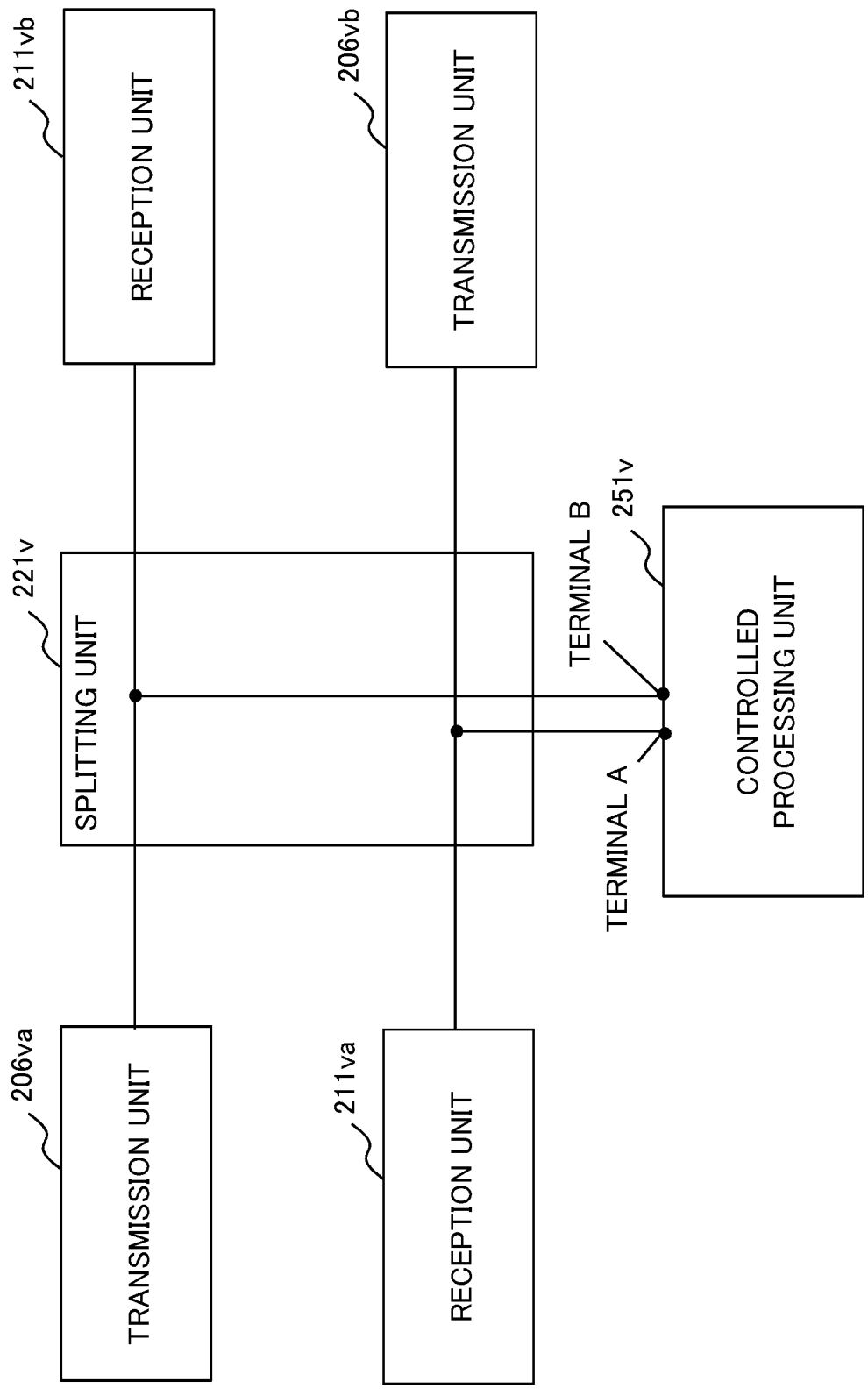
FIG. 5 is a concept diagram illustrating an example of a connection of transmission units and reception units with a controlled processing unit.

FIG. 5 is a concept diagram illustrating an example of a connection between the controlled processing unit 251v and each of the transmission unit 206va, the transmission unit 206vb, the reception unit 211va, and the reception unit 211vb in the controlled blade 20v (v is one or more and equal to or less than N).

The reception unit 211va is connected to a terminal A as an input terminal of the controlled processing unit 251v and to the transmission unit 206vb by a splitting unit 221v. The reception unit 211vb and a terminal B as an output terminal of the controlled processing unit 251v are connected to the transmission unit 206va by the splitting unit 221v.

[Processing Flow Example]

Figure 6:
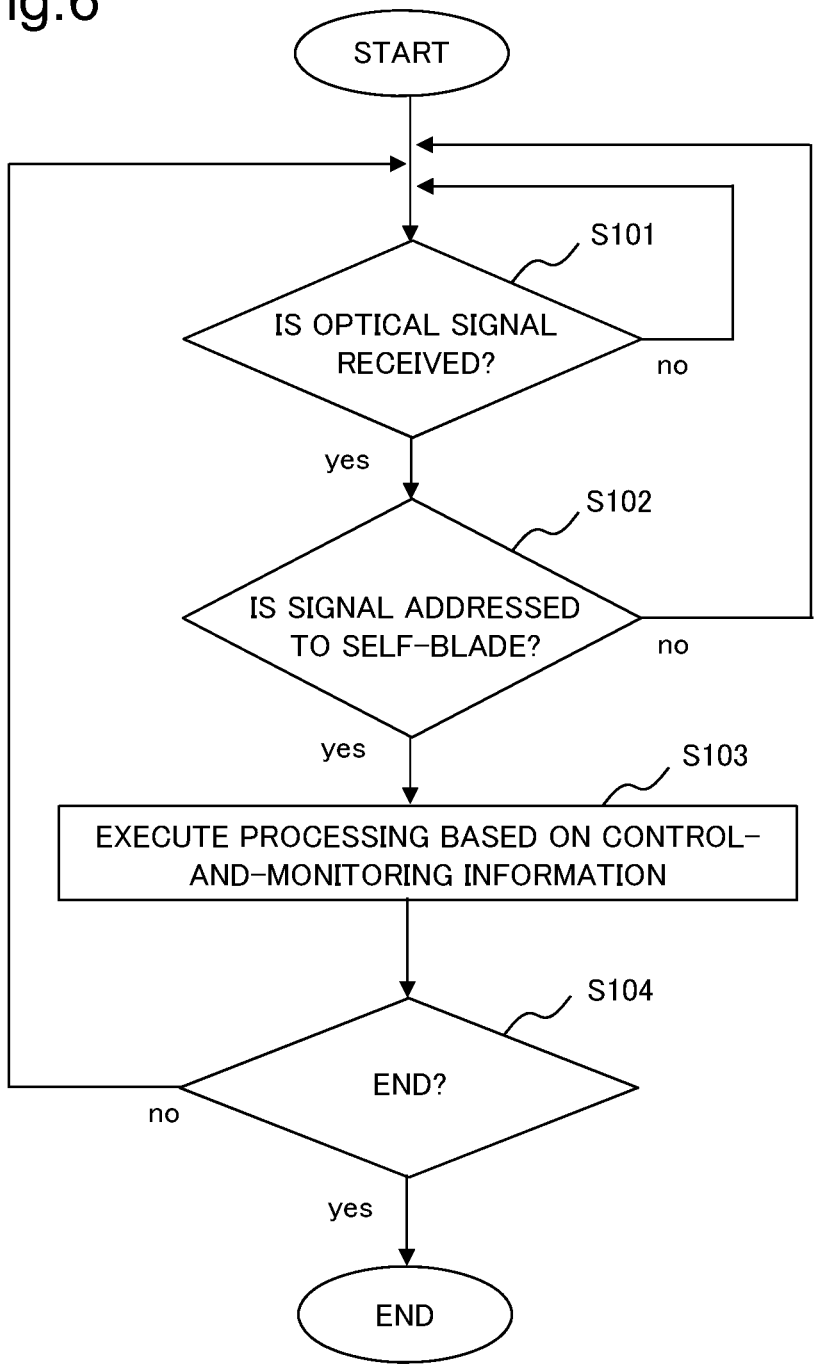
FIG. 6 is a concept diagram that illustrates a processing flow example of processing performed, by the controlled processing unit, concerning sent control-and-monitoring information.

FIG. 6 is a concept diagram that illustrates a processing flow example of processing performed, by the controlled processing unit 251v, concerning sent control-and-monitoring information. When a value of v is 1, an optical signal including the control-and-monitoring information is sent directly to the controlled blade 20v by the control blade 100. When a value of v is equal to or more than 2 and equal to or less than N, the optical signal is sent to the controlled blade 20v from the control blade 100 via each controlled blade 20m with a value of m being equal to or less than v–1.

The controlled processing unit 251v starts the processing illustrated in FIG. 6 by input of start information from an outside, for example.

The controlled processing unit 251v performs, as processing of S101, determination of whether the reception unit 211va has received an optical signal.

When a result of the determination performed by the processing of S101 is yes, the controlled processing unit 251v performs processing of S102. Meanwhile, when a result of the determination performed by the processing of S101 is no, the controlled processing unit 251v performs the processing of S101 again.

When performing the processing of S102, the controlled processing unit 251v performs, as the same processing, determination of whether information included in the optical signal is addressed to the controlled blade 20v, the optical signal being determined by the processing of S101 as having been received.

When a result of the determination performed by the processing of S102 is yes, the controlled processing unit 251v performs processing of S103.

Meanwhile, when a result of the determination performed by the processing of S102 is no, the controlled processing unit 251v performs the processing of S101 again.

When performing the processing of S103, the controlled processing unit 251v executes, as the same processing, processing that follows control-and-monitoring information included in the information determined by the processing of S102 as being addressed to the controlled blade 20v.

The controlled processing unit 251v performs, as processing of S104, determination of whether to end the processing illustrated in FIG. 6. For example, the controlled processing unit 251v performs the determination by determining whether end information is input from an outside.

When a result of the determination performed by the processing of S104 is yes, the controlled processing unit 251v ends the processing illustrated in FIG. 6.

Meanwhile, when a result of the determination performed by the processing of S104 is no, the controlled processing unit 251v performs the processing of S101 again.

Advantageous Effects

In the blade device according to the present example embodiment, control-and-monitoring information is sent from the control blade to each controlled blade by optical space communication, not via a wiring on the backboard. Thus, the blade device can decrease the number of wirings in the backboard.

The above description is made on the case where control information and the like is transmitted and received between the blades by optical space communication. However, control information and the like may be transmitted and received between the blades by wireless communication with a radio wave.

However, by transmitting and receiving control information and the like between the blades by optical space communication, the following advantageous points can be expected as compared to the case of the transmission and reception performed by wireless communication with a radio wave.

Light having a wavelength shorter than that of a radio wave is less influenced by diffraction and the like, and directivity is easily given to light. Thus, in an assumed case of mounting at a high density, optical space communication less likely to be influenced by interference is considered to be more advantageous than wireless communication with a radio wave.

Particularly in an assumed case of a transmission device treating a high-speed signal, influence of a radio wave propagating in a space cannot be ignored. Even when electric power of a radio wave used for transmitting and receiving information between the blades is weak, there is a possibility that the radio wave interferes with an electric signal passing through a wiring on the blade backboard occurs, and causes an increase in signal errors, a decline in noise resistance, adverse influence on a jitter/wander characteristic, and the like. Accordingly, also from this standpoint, optical space communication in which influence on an electric signal passing through a wiring can be ignored is considered to be more advantageous than wireless communication with a radio wave.

Figure 7:
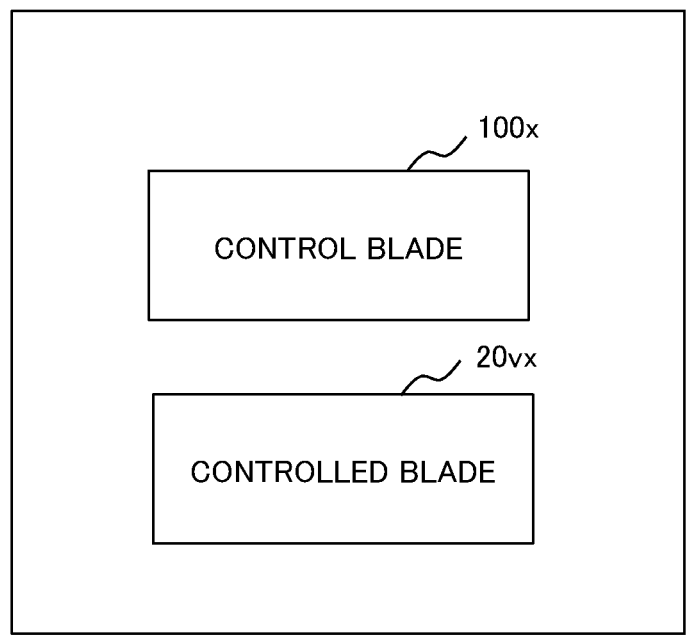
FIG. 7 is a block diagram illustrating the minimum configuration of a blade device according to an example embodiment.

FIG. 7 is a block diagram illustrating a configuration of a blade device 506x that is the minimum configuration of the blade device according to an example embodiment.

The blade device 506x includes a control blade 100x and a controlled blade 20vx.

By wireless communication, the control blade 100x sends, to the controlled blade 20vx, first information that is at least one of control information for controlling the controlled blade 20vx and monitoring information for monitoring the controlled blade 20vx.

The controlled blade 20vx performs processing that follows the received first information.

The control blade 100x sends the first information to the controlled blade 20vx by optical space communication. Thus, the blade device 506x does not need a wiring for sending the first information to the controlled blade 20vx. Accordingly, the blade device 506x can decrease the number of wirings between the blades.

Therefore, by the above-described configuration, the blade device 506x achieves the advantageous effects described above in the section of Advantageous Effects of Invention While each example embodiment of the invention is described above, the invention is not limited to the above-described example embodiments, and a further change, replacement, or adjustment can be added without departing from the basic technical idea of the invention. For example, a configuration of the elements illustrated in each drawing is one example for facilitating understanding of the invention, and there is no limitation to the configurations illustrated in these drawings.

The whole or part of the example embodiments disclosed above can be described as, but not limited to, the following supplementary notes.

(Supplementary Note 1)

A blade device including:

a control blade sending, by wireless communication, to a controlled blade, first information being at least one of control information for controlling the controlled blade and monitoring information for monitoring the controlled blade; and the controlled blade performing processing that follows the received first information.

(Supplementary Note 2)

The blade device according to Supplementary Note 1, wherein the wireless communication is optical space communication.

(Supplementary Note 3)

The blade device according to Supplementary Note 1 or 2, wherein the first information includes sending-destination information representing the controlled blade as a sending destination.

(Supplementary Note 4)

The blade device according to any one of Supplementary Notes 1 to 3, further including a plurality of the controlled blades, wherein, via a first controlled blade as the controlled blade adjacent to the control blade, the control blade sends the first information to a second controlled blade as the controlled blade unadjacent to the control blade, by second optical space communication between the first controlled blade and the second controlled blade.

(Supplementary Note 5)

The blade device according to Supplementary Note 4, wherein there is a case that the control blade sends the first information to the second controlled blade by the second optical space communication performed via two or more of the controlled blades.

(Supplementary Note 6)

The blade device according to Supplementary Note 4 or 5, wherein the control blade sends the first information to the second controlled blade by the second optical space communication performed via all of the controlled blades installed between the control blade and the second controlled blade.

(Supplementary Note 7)

The blade device according to any one of Supplementary Notes 1 to 6, wherein the controlled blade sends second information to the control blade by third optical space communication.

(Supplementary Note 8)

The blade device according to Supplementary Note 7, wherein the wireless communication is based on first optical space communication, and a wavelength of used light differs between the first optical space communication and the third optical space communication.

(Supplementary Note 9)

The blade device according to Supplementary Note 7 or 8, wherein the second information includes sending-source information representing the controlled blade as a sending source.

(Supplementary Note 10)

The blade device according to any one of Supplementary Notes 7 to 9, wherein the second information includes response information to the first information.

(Supplementary Note 11)

The blade device according to any one of Supplementary Notes 7 to 10, further including a plurality of the controlled blades, wherein a fourth controlled blade as the controlled blade unadjacent to the control blade sends the first information to the control blade via a third controlled blade as the controlled blade adjacent to the control blade, by fourth optical space communication between the third controlled blade and the fourth controlled blade.

(Supplementary Note 12)

The blade device according to Supplementary Note 11, wherein there is a case that the fourth controlled blade sends the second information to the control blade by the fourth optical space communication performed via two or more of the controlled blades.

(Supplementary Note 13)

The blade device according to Supplementary Note 11 or 12, wherein the fourth controlled blade sends the second information to the control blade by the fourth optical space communication performed via all of the controlled blades installed between the fourth controlled blade and the control blade.

(Supplementary Note 14)

The blade device according to any one of Supplementary Notes 1 to 13, wherein the control blade and the controlled blade are substantially parallel to each other.

(Supplementary Note 15)

The blade device according to any one of Supplementary Notes 1 to 14, wherein the control blade and the controlled blade are stored in a shelf.

(Supplementary Note 16)

The blade device according to any one of Supplementary Notes 1 to 15, wherein an electric wiring is provided between the control blade and the controlled blade.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

REFERENCE SIGNS LIST

100 Control blade
101, 2011, 2012, 201N, 201v Substrate

102 Hub
103 Control processing unit
106b, 2061a, 2061b, 2062a, 2062b, 206Na, 206Nb, 206vb Transmission unit
111b, 2111a, 2111b, 2112a, 2112b, 211Na, 211Nb, 211vb Reception unit
1160a, 1160b, 2161a, 2161b, 2162a, 2162b, 216Na, 216Nb, 216va, 216vb Connector
201, 202, 20N, 20v Controlled blade
Splitting unit 221v
2511, 2512, 251N, 251v Controlled processing unit
261 Backboard
501, 506 Blade device
901a, 901b, 901c Arrow
906a, 906b Surface
A, B Terminal

The invention claimed is:

1. A blade device comprising:
a control blade configured to send, by wireless communication, to a controlled blade, first information being at least one of control information for controlling the controlled blade and monitoring information for monitoring the controlled blade; and
the controlled blade configured to perform processing that follows the received first information,
wherein the controlled blade is configured to send second information to the control blade by third optical space communication, and
wherein the wireless communication is based on first optical space communication, and a wavelength of used light differs between the first optical space communication and the third optical space communication.

2. The blade device according to claim 1, wherein the wireless communication is optical space communication.

3. The blade device according to claim 1, wherein the first information includes sending-destination information representing the controlled blade as a sending destination.

4. The blade device according to claim 1, further comprising a plurality of the controlled blades,
wherein, the control blade is configured to, via a first controlled blade as the controlled blade adjacent to the control blade, send the first information to a second controlled blade as the controlled blade unadjacent to the control blade, by second optical space communication between the first controlled blade and the second controlled blade.

5. The blade device according to claim 4, wherein the control blade is configured to send the first information to the second controlled blade by the second optical space communication performed via two or more of the controlled blades.

6. The blade device according to claim 4, wherein the control blade is configured to send the first information to the second controlled blade by the second optical space communication performed via all of the controlled blades installed between the control blade and the second controlled blade.

7. The blade device according to claim 1, wherein the second information includes sending-source information representing the controlled blade as a sending source.

8. The blade device according to claim 1, wherein the second information includes response information to the first information.

9. The blade device according to claim 1, further comprising a plurality of the controlled blades,
wherein a fourth controlled blade as the controlled blade unadjacent to the control blade is configured to send the first information to the control blade via a third controlled blade as the controlled blade adjacent to the control blade, by fourth optical space communication between the third controlled blade and the fourth controlled blade.

10. The blade device according to claim 9, wherein the fourth controlled blade is configured to send the second information to the control blade by the fourth optical space communication performed via two or more of the controlled blades.

11. The blade device according to claim 9, wherein the fourth controlled blade is configured to send the second information to the control blade by the fourth optical space communication performed via all of the controlled blades installed between the fourth controlled blade and the control blade.

12. The blade device according to claim 1, wherein the control blade and the controlled blade are substantially parallel to each other.

13. The blade device according to claim 1, wherein the control blade and the controlled blade are stored in a shelf.

14. The blade device according to claim 1, wherein an electric wiring is provided between the control blade and the controlled blade.

* * * * *